(12) United States Patent
Jang et al.

(10) Patent No.: US 10,741,731 B2
(45) Date of Patent: Aug. 11, 2020

(54) MULTI-EMISSION QUANTUM DOT AND QUANTUM DOT FILM, LED PACKAGE, EMITTING DIODE AND DISPLAY DEVICE INCLUDING THE SAME

(71) Applicant: LG Display Co., Ltd., Seoul (KR)

(72) Inventors: Kyung-Kook Jang, Paju-si (KR); Ji-Yeon Kang, Paju-si (KR); So-Mang Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 16/134,447

(22) Filed: Sep. 18, 2018

(65) Prior Publication Data

US 2019/0103524 A1   Apr. 4, 2019

(30) Foreign Application Priority Data

Sep. 19, 2017   (KR) .................. 10-2017-0120425

(51) Int. Cl.
*H01L 21/00*   (2006.01)
*H01L 33/50*   (2010.01)
*G02F 1/13357*   (2006.01)
*H01L 33/56*   (2010.01)

(52) U.S. Cl.
CPC ...... *H01L 33/504* (2013.01); *G02F 1/133603* (2013.01); *H01L 33/56* (2013.01); *G02F 2202/36* (2013.01); *H01L 33/505* (2013.01)

(58) Field of Classification Search
CPC .. H01L 33/504; H01L 33/56; G02F 1/133603
See application file for complete search history.

(56) References Cited

U.S. PATENT DOCUMENTS

| | | | | |
|---|---|---|---|---|
| 7,892,452 B2* | 2/2011 | Ryowa | ................ | C09K 11/025 |
| | | | | 252/301.4 R |
| 9,412,905 B2* | 8/2016 | Su | ............................ | F21V 9/38 |
| 9,580,647 B2* | 2/2017 | Battaglia | ............... | B82Y 20/00 |
| 9,696,317 B2* | 7/2017 | Yang | .................... | C09K 11/562 |
| 9,722,198 B2* | 8/2017 | Murayama | .......... | C09K 11/565 |
| 9,773,942 B2* | 9/2017 | Kazama | ................... | C30B 29/16 |
| 10,066,164 B2* | 9/2018 | Qiao | ..................... | H01L 33/502 |
| 10,217,953 B2* | 2/2019 | He | ........................ | H01L 51/502 |
| 10,294,421 B2* | 5/2019 | Fan | ....................... | C09K 11/565 |
| 2013/0215495 A1* | 8/2013 | Thylen | ................. | G02F 1/0126 |
| | | | | 359/341.3 |
| 2016/0211409 A1* | 7/2016 | Kazama | ................... | H01L 21/00 |
| 2016/0233449 A1* | 8/2016 | Murayama | .......... | C09K 11/883 |
| 2018/0040783 A1* | 2/2018 | Shimizu | ................ | G01R 33/06 |
| 2018/0100102 A1* | 4/2018 | Fan | ....................... | C09K 11/565 |
| 2019/0115550 A1* | 4/2019 | Kim | ..................... | H01L 51/502 |

* cited by examiner

*Primary Examiner* — Laura M Menz
(74) *Attorney, Agent, or Firm* — Fenwick & West LLP

(57) ABSTRACT

A multi-emission quantum dot includes a first core having a first thickness along an axis from a first surface to a second surface of the first core, a first shell enclosing the first core, a second core surrounding the first shell. The second core may has a second thickness along the same axis smaller than the first thickness. The quantum dot also includes a second shell enclosing the second core. The first core may be configured to emit light of a first color, and the second core may be configured to emit light of a second color different from the first color.

18 Claims, 15 Drawing Sheets

MULTI-EMISSION QUANTUM DOT AND QUANTUM DOT FILM, LED PACKAGE, EMITTING DIODE AND DISPLAY DEVICE INCLUDING THE SAME

CROSS-REFERENCE TO RELATED APPLICATIONS

The present application claims priority to Republic of Korea Patent Application No. 10-2017-0120425 filed in the Republic of Korea on Sep. 19, 2017, which is hereby incorporated by reference in its entirety.

BACKGROUND

Field of Technology

The present disclosure relates to a quantum dot (QD), and more particularly, to a multi-emission QD being capable of emitting different wavelength lights and a QD film, a light emitting diode (LED) package, an emitting diode and a display device including the same.

Discussion of the Related Art

As information technology and mobile communication technology have been developed, a display device being capable of displaying a visual image has also been developed. Flat panel display devices, such as a liquid crystal display (LCD) device, a plasma display panel (PDP) device, a field emission display (FED) device, and an organic light emitting diode (OLED) device, has been introduced.

On the other hand, use of quantum dots (QD) to display devices has been researched or studied.

In the QD, an electron in an unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

FIG. 1 is a schematic view illustrating the related art QD.

As shown in FIG. 1, the QD 1 includes a core 10 and a shell 20. Generally, cadmium selenide (CdSe) is widely used for the core 10. The QD 1 including the CdSe core 10 has an advantage in color purity.

SUMMARY

Accordingly, the present disclosure is directed to a multi-emission QD and a QD film, a light emitting diode (LED) package, an emitting diode and a display device including the same that substantially obviate one or more of the problems due to limitations and disadvantages of the related art.

Additional features and advantages of the disclosure will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments relate to a quantum dot including a first core having a first thickness along an axis from a first surface to a second surface of the first core, a first shell enclosing the first core, a second core surrounding the first shell. The second core may has a second thickness along the same axis smaller than the first thickness. The quantum dot also includes a second shell enclosing the second core.

Embodiments also relate to a quantum dot including a first core configured to emit light of a first color, a first shell enclosing the first core, a second core surrounding the first shell. The second core is configured to emit light of a second color different from the first color. The quantum dot also includes a second shell enclosing the second core.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

The related art QD emits light having single wavelength range. Accordingly, for example, when the QD is used for a white light emitting diode display device, where an emitting diode emits white light and a color filter is used to provide a color image, all of a red emission stack (or layer), a green emission stack (or layer) and a blue emission stack (or layer) are required.

New quantum dot being capable of emitting lights of different wavelength ranges is provided.

Reference will now be made in detail to the preferred embodiments, examples of which are illustrated in the accompanying drawings.

Figure 1:
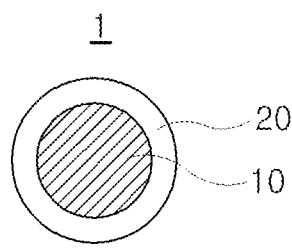
FIG. 1 is a schematic view illustrating the related art QD.
Figure 2:
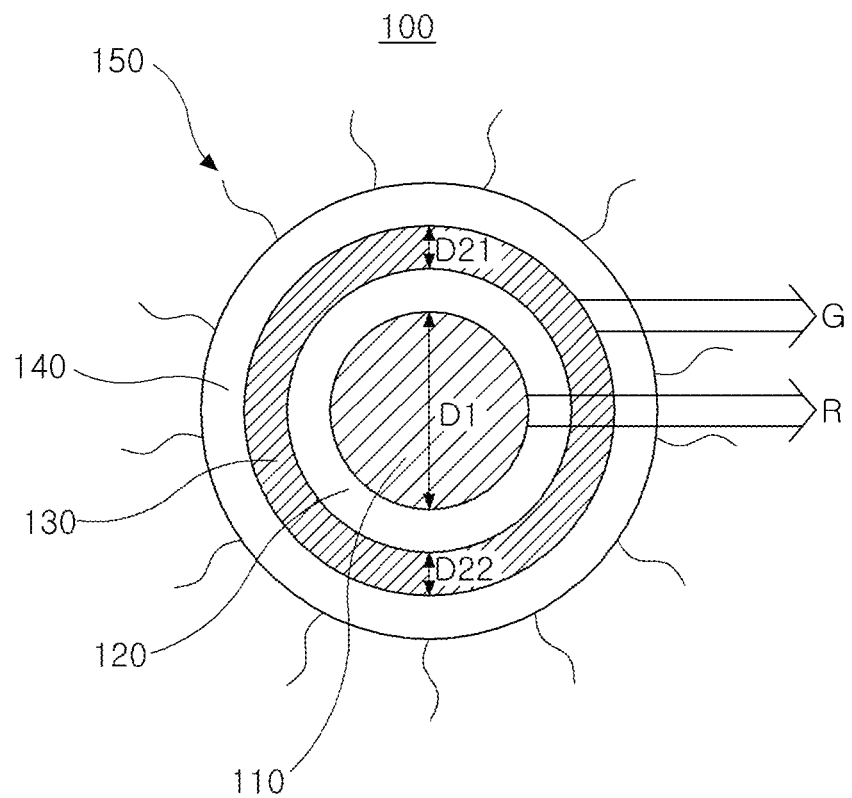
FIG. 2 is a schematic view illustrating a multi-emission QD according to a first embodiment of the present disclosure.

FIG. 2 is a schematic view illustrating a multi-emission QD according to a first embodiment of the present disclosure.

As shown in FIG. 2, a multi-emission QD 100 includes a first core (inner core) 110, a first shell (inner shell) 120 enclosing (covering) the first core 110, a second core (outer core) 130 enclosing the first shell 120 and a second shell (outer shell) 140 enclosing the second core 130. Namely, the first core 110 is positioned in a center of the multi-emission QD 100, and the second core 130 is positioned at an outer side of the first shell 110. The first shell 120 is positioned between the first and second cores 110 and 130, and the second shell 140 is positioned at an outer side of the second core 130 such that the second core 130 is positioned between the first and second shells 120 and 140.

The multi-emission QD 100 may further include a ligand 150 combined at an outer surface of the second shell 140. However, the ligand 150 may be omitted.

Each of the first and second cores 110 and 130 includes a semiconductor material having a first energy bandgap, and each of the first and second shells 120 and 140 includes a semiconductor material having a second energy bandgap being greater than the first energy bandgap.

For example, each of the first and second cores 110 and 130 may independently include one of InP, InGaP, CdSe and CdSeS, and each of the first and second shells 120 and 140 may include ZnS.

The first core 110 may have a thickness along an axis from a first surface to a second surface of the first core 110. The second core 130 may surround the first shell, and have a thickness along the axis that is smaller than the thickness of the first core 110. Specifically, the thickness of the second core 130 may be a combination of a thickness of a part of the second core on the first surface of the first core 110 and a thickness of another part of the second core on the second surface of the first core 110. For example, as shown in FIG. 2, the first core 110 has a first thickness "D1", and the second core 130 has a second thickness "D21+D22" being smaller than the first thickness "D1". As a result, a first wavelength light is emitted form the first core 110 to generate light of a first color, and a second wavelength light is emitted from the second core 130 to generate light a second color different from the first color. Namely, the multi-emission QD 110 of the present disclosure has a multi-emission property (characteristic) emitting the first wavelength light and the second wavelength light at the same time. For example, the first wavelength may be about 600 to 700 nm, and the second wavelength may be about 500 to 600 nm. In other words, the first core 110 may provide red light, and the second core 130 may provide green light. The multi-emission QD 100 of the present disclosure emits light having two maximum peaks.

As mentioned above, the first and second cores 110 and 130 include (or are formed of) the semiconductor material having the first energy bandgap. If a metal is doped into the semiconductor material of at least one of the first and second cores, a full width half maximum (FWHM) of the light from the QD is greatly increased. Namely, when the metal is doped into the first core and/or the second core, the color purity of the multi-emission QD is decreased.

In addition, the first core 110 has the first thickness "D1", and the second core 130 has the second thickness "D21+D22" being smaller than the first thickness "D1". If the second core has a thickness greater than the first core, the light from the first core is absorbed by the second core such that the QD does not have a multi-emission characteristic or the color balance is degraded.

The QD absorbs shorter wavelength light and emits longer wavelength light. In addition, as the size (thickness) of the core is smaller, the wavelength of the light from the QD is shorter. If the thickness of the second core is greater than that of the first core, shorter wavelength light from the first core is absorbed by the second core such that the light from the first core is lost. As a result, the QD does not have a multi-emission characteristic or the color balance is degraded.

However, in the multi-emission QD 100 of the present disclosure, since the thickness of the second core 130 is smaller than that of the first core 110, the light from the first core 110 is not absorbed by the second core 130 such that both of the light from the first core 110 and the light from the second core 130 are emitted from the multi-emission QD 100. Namely, the multi-emission characteristic is provided.

Synthesis of QD (1) Synthesis of InP/ZnS Particle

Figure 16:
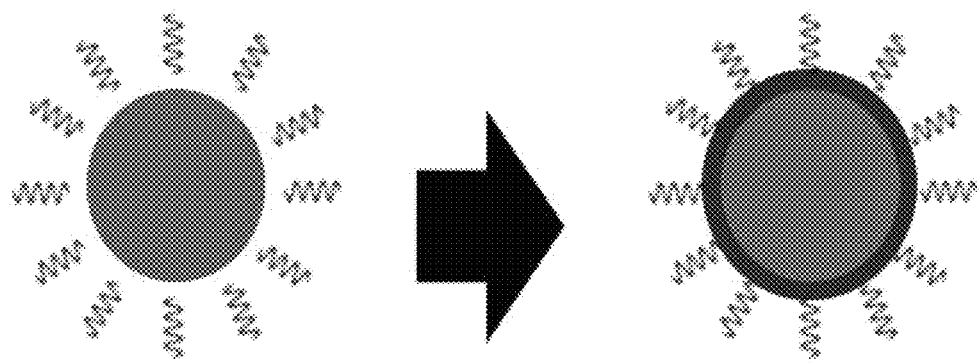
FIG. 16 illustrates synthesis of InP/ZnS particle, according to an embodiment of the present disclosure.

Indium acetate (0.6 mmol), zinc stearate (1.8 mmol), oleic acid (2 mmol) and octadecene (30 mL) were mixed and stirred under the temperature of 120° C. for 1 hr. The mixture was heated to 300° C. under $N_2$ condition and stirred for 10 minutes. Tristrimethylsilyl phosphine (0.6 mmol) was added and stirred for 1 hr. After additional stirring for 30 minutes, the mixture was cooled into 230° C. 1M sulfur/trioctylphosphine solution (3 mL) was added and stirred for 1 hr. By refining the mixture using toluene and acetone, InP/ZnS particle was obtained, as illustrated in FIG. 16.

(2) Synthesis of InP/ZnS/InP/ZnS QD

Figure 17:
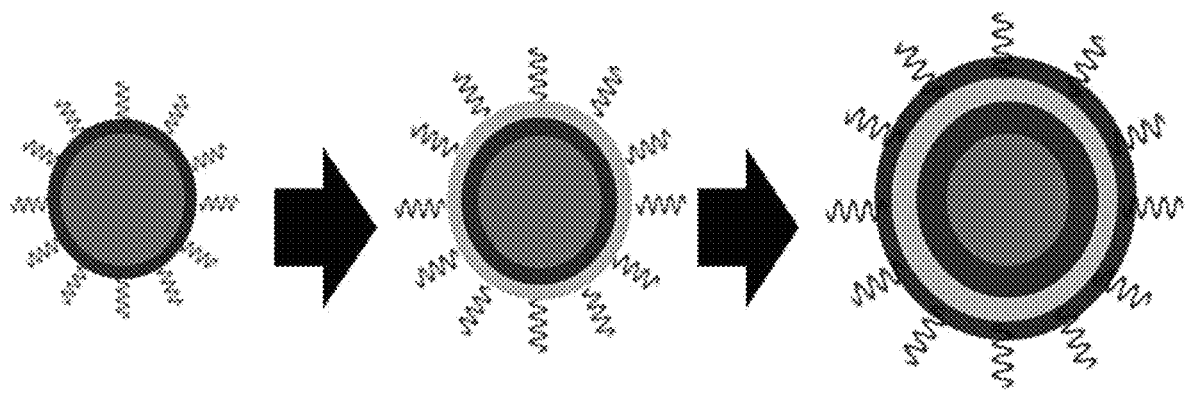
FIG. 17 illustrates synthesis of InP/ZnS/InP/ZnS QD, according to an embodiment of the present disclosure.

InP/ZnS particle, indium acetate (0.6 mmol), zinc stearate (1.2 mmol), oleic acid (2 mmol) and octadecene (30 mL) was mixed and stirred under vacuum condition and the temperature of 120° C. for 1 hr. The mixture was heated to 300° C. under $N_2$ condition and stirred for 10 minutes. Tristrimethylsilyl phosphine (0.6 mmol) was added and stirred for 10 minutes. After additional stirring for 30 minutes, the mixture was cooled into 230° C. Dodecanethiol (3 mmol) was added and stirred for 1 hr. By refining the mixture using toluene and acetone five times, InP/ZnS/InP/ZnS QD was obtained, as illustrated in FIG. 17.

Figure 3A:
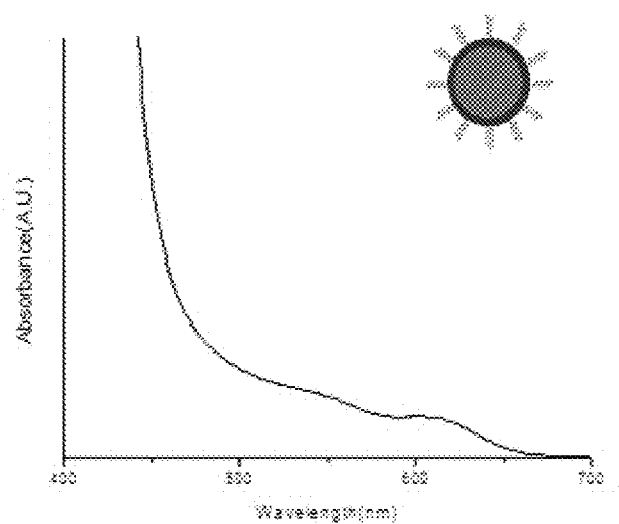
FIGS. 3A and 3B are graphs showing an absorption spectrum and an emission spectrum of the intermediate compound in a synthesis of a multi-emission QD according to the first embodiment of the present disclosure.
Figure 3B:
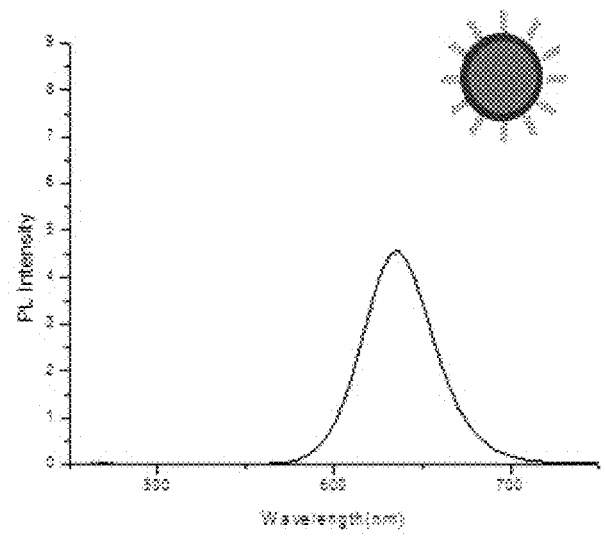

FIGS. 3A and 3B are graphs showing an absorption spectrum and an emission spectrum of the intermediate compound in a synthesis of a multi-emission QD according to the first embodiment of the present disclosure. Namely, FIGS. 3A and 3B are graphs showing an absorption spectrum and an emission spectrum of the InP/ZnS particle.

As shown in FIGS. 3A and 3B, the InP/ZnS particle absorbs short wavelength light and emits long wavelength light, i.e., about wavelength of 600~700 nm.

Figure 4A:
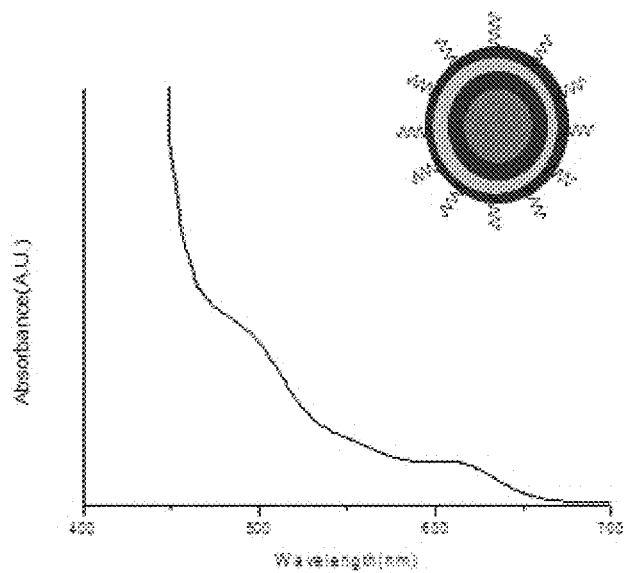
FIGS. 4A and 4B are graphs showing an absorption spectrum and an emission spectrum of a multi-emission QD according to the first embodiment of the present disclosure.
Figure 4B:
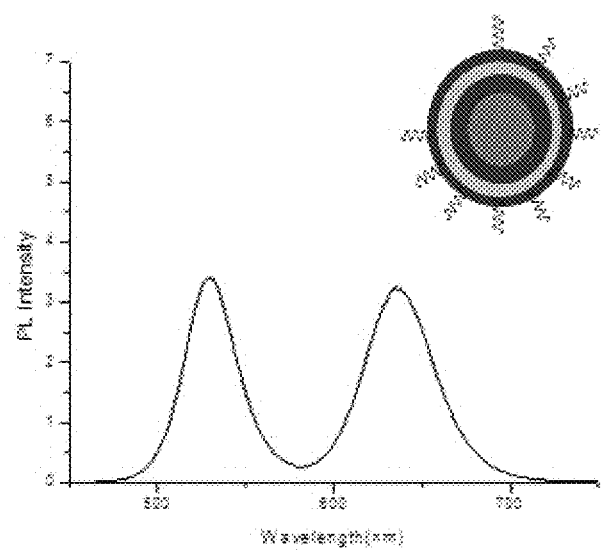

FIGS. 4A and 4B are graphs showing an absorption spectrum and an emission spectrum of a multi-emission QD according to the first embodiment of the present disclosure. Namely, FIGS. 4A and 4B are graphs showing an absorption spectrum and an emission spectrum of the InP/ZnS/InP/ZnS QD.

As shown in FIGS. 4A and 4B, the multi-emission QD of the present disclosure emits both of the first light having a first wavelength of about 600 to 700 nm and the second light having a second wavelength of about 500 to 600 nm. Namely, the QD of the present disclosure has a multi-emission characteristic (property).

Figure 5A:
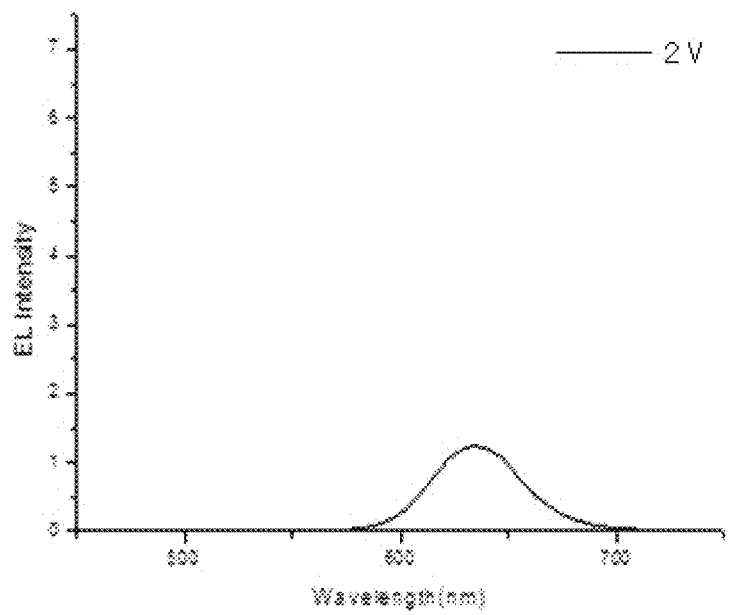
FIGS. 5A to 5C are graphs showing an emission spectrum of a multi-emission QD according to the first embodiment of the present disclosure with respect to applied voltages.
Figure 5B:
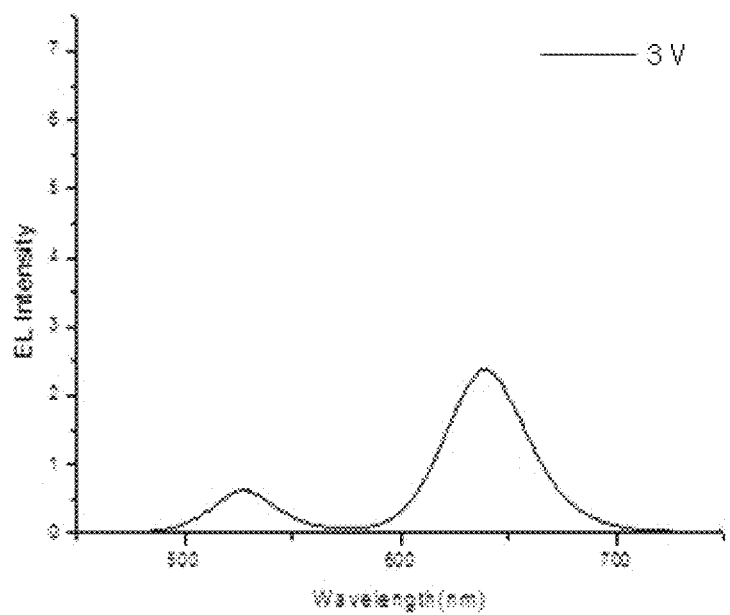
Figure 5C:
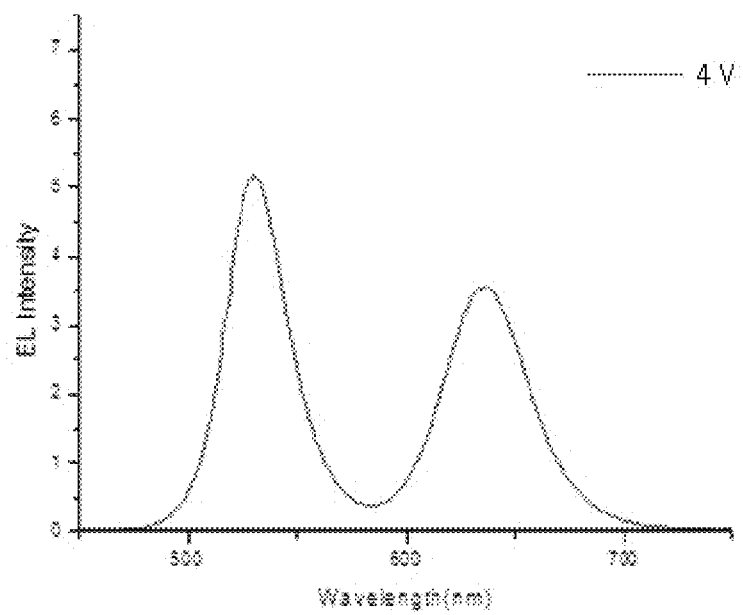

FIGS. 5A to 5C are graphs showing an emission spectrum of a multi-emission QD according to the first embodiment of the present disclosure with respect to applied voltages. The electroluminescent (EL) spectrum is measured and shown in FIGS. 5A to 5C with applying different voltages to the multi-emission QD of the first embodiment of the present disclosure, and a maximum EL spectrum (λmax) and the FWHM are listed in Table 1.

TABLE 1

|  | InP/ZnS/InP/ZnS |
| --- | --- |
| λmax (Green/Red) | 530/636 |
| FWHM | 35/47 |

As shown in FIG. 5B, the multi-emission QD emits a first wavelength light (600 to 700 nm, red) having a first intensity and a second wavelength light (500 to 600 nm, green) having a second intensity being smaller than the first intensity with a first voltage (3V). As shown in FIG. 5C, the multi-emission QD emits the first wavelength light (600 to 700 nm, Red) having a third intensity and the second wavelength light (500 to 600 nm, green) having a fourth intensity being greater than the third intensity with a second voltage (4V) being greater than the first voltage.

On the other hand, as shown in FIG. 5A, the first wavelength light without the second wavelength light may be emitted from the QD with a third voltage (2V) being smaller than the first voltage. Thus, when a first voltage smaller than a second voltage is applied, an intensity of light of a first color emitted from the first core 110 may be greater than an intensity of light of a second color emitted from the second core 130, where the wavelength of light of the first color is longer than a wavelength of light of the second color. When a second voltage is applied, the intensity of light of the second color may be greater than the intensity of light of the first color.

In addition, as shown in Table 1, the multi-emission QD provide relatively narrow FWHM in both of the first wavelength light (red) and the second wavelength light (green) such that the light having high color purity is provided by the multi-emission QD.

Figure 6:
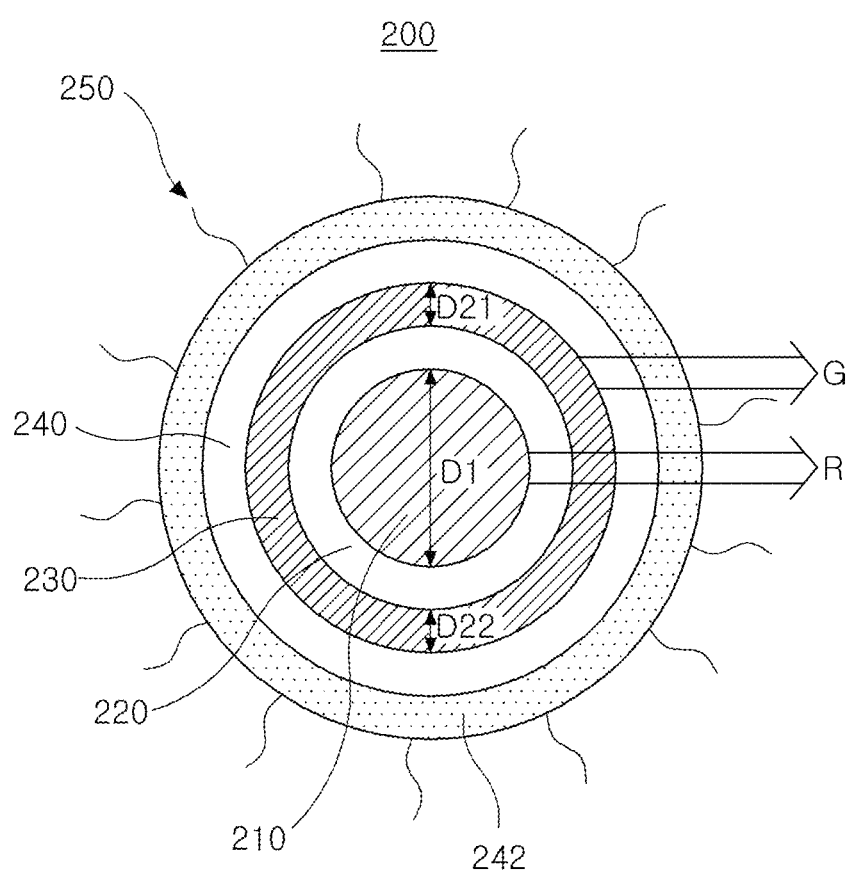
FIG. 6 is a schematic view illustrating a multi-emission QD according to a second embodiment of the present disclosure.

FIG. 6 is a schematic view illustrating a multi-emission QD according to a second embodiment of the present disclosure.

As shown in FIG. 6, a multi-emission QD 200 includes a first core 210, a first shell 220 enclosing (covering) the first core 210, a second core 230 enclosing the first shell 220, a second shell 240 enclosing the second core 230 and a third shell 242 enclosing the second shell 240. Namely, the first core 210 is positioned in a center of the multi-emission QD 200, and the second core 230 is positioned at an outer side of the first shell 220. The first shell 220 is positioned between the first and second cores 210 and 230, and the second shell 240 is positioned at an outer side of the second core 230 such that the second core 230 is positioned between the first and second shells 220 and 240. In addition, the third shell 242 is positioned at an outer side of the second shell 240 such that the second shell 240 is positioned between the second core 230 and the third shell 242.

The multi-emission QD 200 may further include a ligand 250 combined at an outer surface of the third shell 242. However, the ligand 250 may be omitted. In addition, when the third shell 242 is omitted, the ligand 250 is combined at a surface of the second shell 240.

Each of the first and second cores 210 and 230 includes a semiconductor material having a first energy band gap, and each of the first and second shell 220 and 240 and the third shell 242 include semiconductor materials respectively having second and third energy band gaps being greater than the first energy band gap.

For example, each of the first and second cores 210 and 230 may independently include one of InP, InGaP, CdSe and CdSeS, and each of the first and second shells 220 and 240 may include ZnSe. The third shell 242 may include ZnS.

The first core 210 may have a thickness along an axis from a first surface to a second surface of the first core 210. The second core 230 may surround the first shell 220, and have a thickness along the axis that is smaller than the thickness of the first core 210. Specifically, the thickness of the second core 230 may be a combination of a thickness of a part of the second core 230 on the first surface of the first core 210 and a thickness of another part of the second core on the second surface of the first core 210. For example, as shown in FIG. 6, The first core 210 has a first thickness "D1", and the second core 230 has a second thickness "D21+D22" being smaller than the first thickness "D1". As a result, a first wavelength light is emitted from the first core 210 to generate light of a first color, and a second wavelength light is emitted from the second core 230 to generate light of a second color different from the first color. Namely, the multi-emission QD 210 of the present disclosure has a multi-emission property (characteristic) emitting the first wavelength light and the second wavelength light at the same time. For example, the first wavelength may be about 600 to 700 nm, and the second wavelength may be about 500 to 600 nm. In other words, the first core 210 may provide red light, and the second core 230 may provide green light. The multi-emission QD 200 of the present disclosure emits light having two maximum peaks.

In addition, the FWHM of the light from the multi-emission QD 200 is reduced by the first and second shells 220 and 240 including ZnSe. Namely, the color purity of the light from the multi-emission QD 200 is further improved by the first and second shells 220 and 240 of ZnSe. In addition, the third shell 242 of ZnS has an energy band gap being greater than each of the first and second shells 220 and 240 such that a quantum efficiency of the multi-emission QD 200 is increased.

As mentioned above, the first and second cores 210 and 230 include (or are formed of) the semiconductor material having the first energy bandgap. If a metal is doped into the semiconductor material of at least one of the first and second cores, a full width half maximum (FWHM) of the light from the QD is greatly increased. Namely, when the metal is doped into the first core and/or the second core, the color purity of the multi-emission QD is decreased.

In addition, the first core 210 has the first thickness "D1", and the second core 230 has the second thickness "D21+D22" being smaller than the first thickness "D1". If the second core has a thickness greater than the first core, the light from the first core is absorbed by the second core such that the QD does not have a multi-emission characteristic or the color balance is degraded.

The QD absorbs shorter wavelength light and emits longer wavelength light. In addition, as the size (thickness) of the core is smaller, the wavelength of the light from the QD is shorter. If the thickness of the second core is greater than that of the first core, shorter wavelength light from the first core is absorbed by the second core such that the light from the first core is lost. As a result, the QD does not have a multi-emission characteristic or the color balance is degraded.

However, in the multi-emission QD 200 of the present disclosure, since the thickness of the second core 230 is smaller than that of the first core 210, the light from the first core 210 is not absorbed by the second core 230 such that both of the light from the first core 210 and the light from the second core 230 are emitted from the multi-emission QD 200. Namely, the multi-emission characteristic is provided.

Synthesis of QD (1) Synthesis of InP/ZnSe Particle

Figure 18:
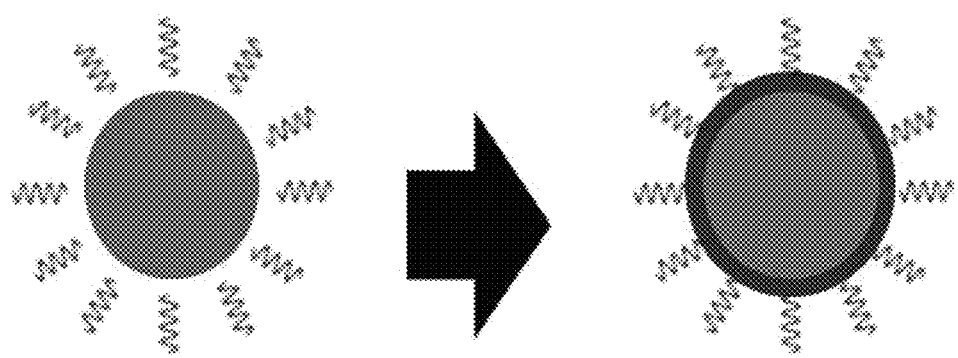
FIG. 18 illustrates synthesis of InP/ZnSe particle, according to an embodiment of the present disclosure.

Indium acetate (0.6 mmol), zinc stearate (1.8 mmol), oleic acid (2 mmol) and octadecene (30 mL) were mixed and stirred under the temperature of 120° C. for 1 hr. The mixture was heated to 300° C. under $N_2$ condition and stirred for 10 minutes. Tristrimethylsilyl phosphine (0.6 mmol) was added and stirred for 1 hr. After additional stirring for 30 minutes, the mixture was cooled into 230° C. 1M Selenium/trioctylphosphine solution (3 mL) was added and stirred for 1 hr. By refining the mixture using toluene and acetone, InP/ZnSe particle was obtained, as illustrated in FIG. 18.

(2) Synthesis of InP/ZnSe/InP/ZnSe/ZnS QD

Figure 19:
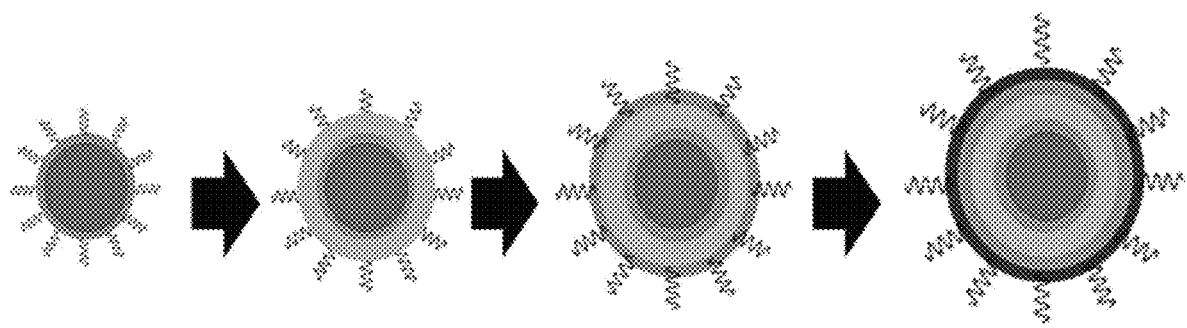
FIG. 19 illustrates synthesis of InP/ZnSe/InP/ZnSe/ZnS QD, according to an embodiment of the present disclosure.

InP/ZnSe particle, indium acetate (0.6 mmol), zinc stearate (1.2 mmol), oleic acid (2 mmol) and octadecene (30 mL) was mixed and stirred under vacuum condition and the temperature of 120° C. for 1 hr. The mixture was heated to 300° C. under $N_2$ condition and stirred for 10 minutes. Tristrimethylsilyl phosphine (0.6 mmol) was added and stirred for 10 minutes. After additional stirring for 30 minutes, the mixture was cooled into 230° C. 1M Selenium/trioctylphosphine solution (3 mL) was added and stirred under vacuum condition and the temperature of 120° C. for 1 hr. After the mixture was heated to 230° C. under $N_2$ condition, 1-dodecanethiol (5 mmol) was added and stirred for 2 hr. After the mixture was cooled into the room temperature, InP/ZnSe/InP/ZnSe/ZnS QD was obtained by refining the mixture using toluene and acetone, as illustrated in FIG. 19.

Figure 7A:
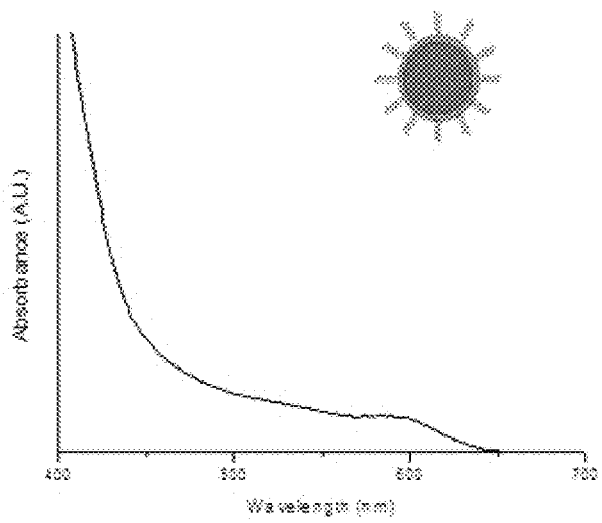
FIGS. 7A and 7B are graphs showing an absorption spectrum and an emission spectrum of the intermediate compound in a synthesis of a multi-emission QD according to the second embodiment of the present disclosure.
Figure 7B:
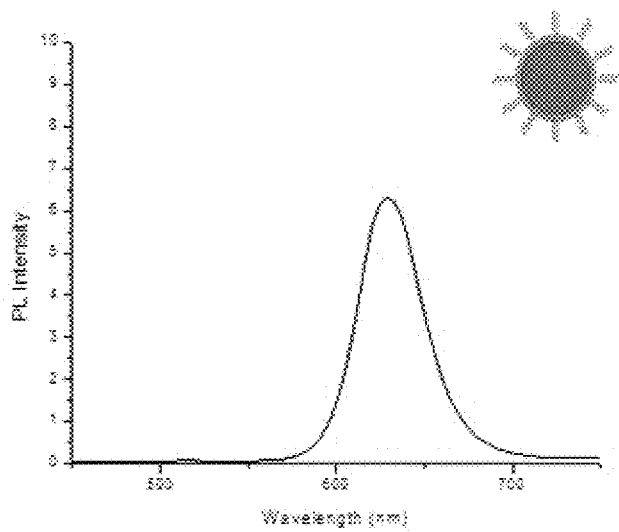

FIGS. 7A and 7B are graphs showing an absorption spectrum and an emission spectrum of the intermediate compound in a synthesis of a multi-emission QD according to the second embodiment of the present disclosure. Namely, FIGS. 7A and 7B are graphs showing an absorption spectrum and an emission spectrum of the InP/ZnSe particle.

As shown in FIGS. 7A and 7B, the InP/ZnSe particle absorbs short wavelength light and emits long wavelength light, i.e., about wavelength of 600~700 nm.

Figure 8A:
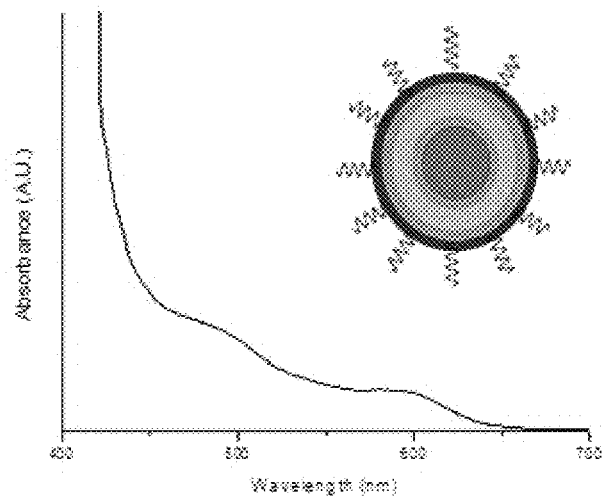
FIGS. 8A and 8B are graphs showing an absorption spectrum and an emission spectrum of a multi-emission QD according to the second embodiment of the present disclosure.
Figure 8B:
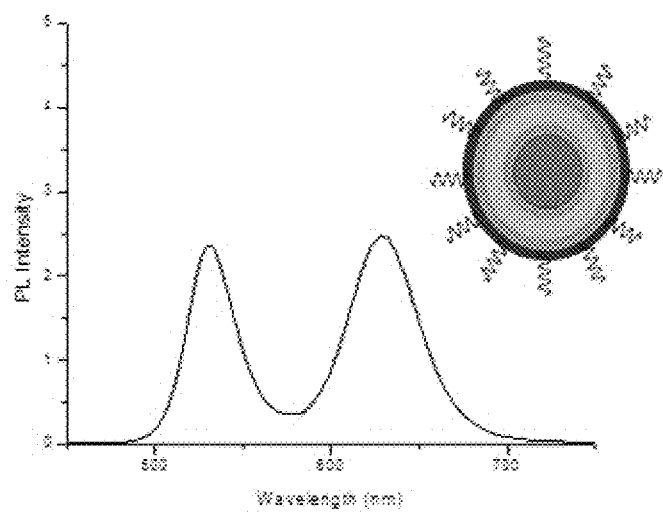

FIGS. 8A and 8B are graphs showing an absorption spectrum and an emission spectrum of a multi-emission QD according to the second embodiment of the present disclosure. Namely, FIGS. 8A and 8B are graphs showing an absorption spectrum and an emission spectrum of the InP/ZnSe/InP/ZnSe/ZnS QD.

As shown in FIGS. 8A and 8B, the multi-emission QD of the present disclosure emits both of the first light having a first wavelength of about 600 to 700 nm and the second light having a second wavelength of about 500 to 600 nm. Namely, the QD of the present disclosure has a multi-emission characteristic (property).

Figure 9A:
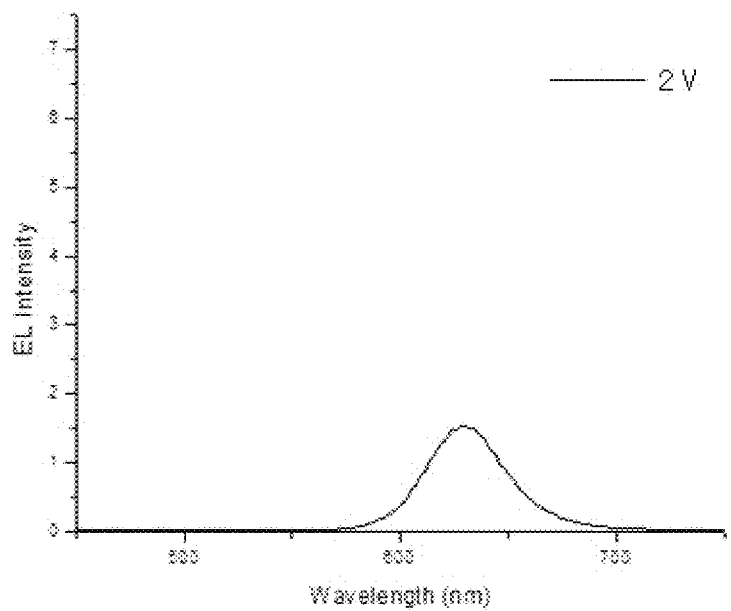
FIGS. 9A to 9C are graphs showing an emission spectrum of a multi-emission QD according to the second embodiment of the present disclosure with respect to applied voltages.
Figure 9B:
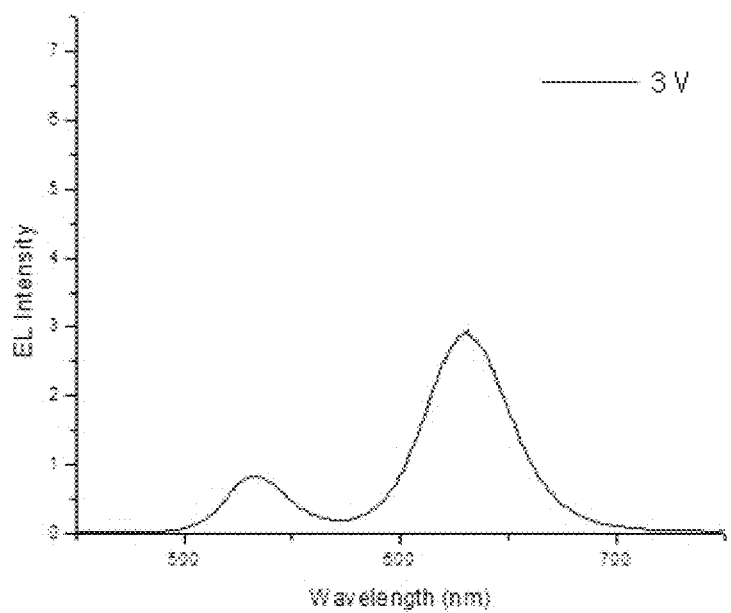
Figure 9C:
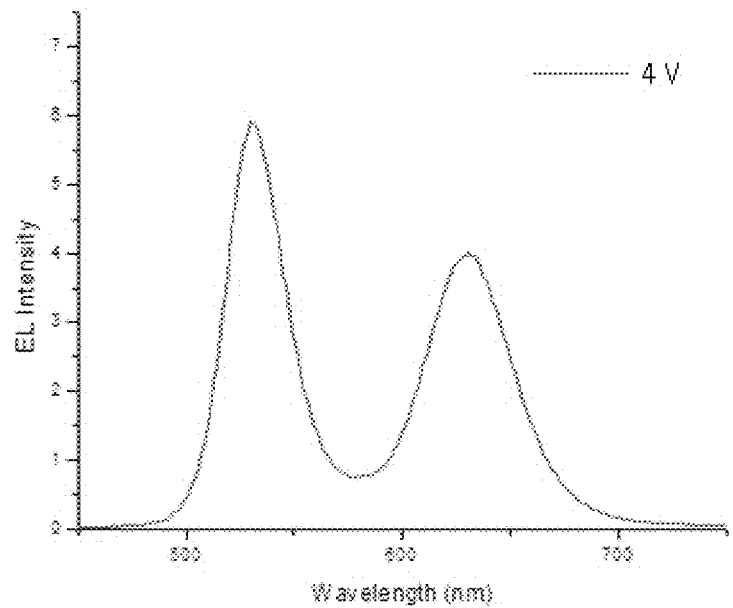

FIGS. 9A to 9C are graphs showing an emission spectrum of a multi-emission QD according to the second embodiment of the present disclosure with respect to applied voltages. The EL spectrum is measured and shown in FIGS. 9A to 9C with applying different voltages to the multi-emission QD of the second embodiment of the present invention, and a maximum EL spectrum (Amax) and the FWHM are listed in Table 2.

TABLE 2

|  | InP/ZnSe/InP/ZnSe/ZnS |
|---|---|
| λmax (Green/Red) | 531/630 |
| FWHM | 32/47 |

As shown in FIG. 9B, the multi-emission QD emits a first wavelength light (600 to 700 nm, red) having a first intensity and a second wavelength light (500 to 600 nm, green) having a second intensity being smaller than the first intensity with a first voltage (3V). As shown in FIG. 9C, the multi-emission QD emits the first wavelength light (600 to 700 nm, Red) having a third intensity and the second wavelength light (500 to 600 nm, green) having a fourth intensity being greater than the third intensity with a second voltage (4V) being greater than the first voltage.

On the other hand, as shown in FIG. 9A, the first wavelength light without the second wavelength light may be emitted from the QD with a third voltage (2V) being smaller than the first voltage.

In addition, as shown in Table 2, the multi-emission QD provide relatively narrow FWHM in both of the first wavelength light (red) and the second wavelength light (green) such that the light having high color purity is provided by the multi-emission QD.

Figure 10:
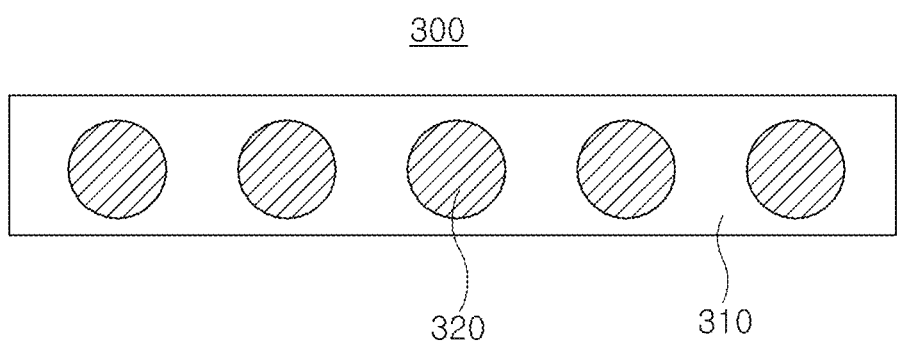
FIG. 10 is a schematic view of a QD film according to an embodiment of the present disclosure.

FIG. 10 is a schematic view of a QD film according to an embodiment of the present disclosure.

As shown in FIG. 10, the QD film 300 includes a plurality of multi-emission QDs 320. The QD film 300 may further include a base material 310, and the multi-emission QDs 320 may be dispersed in the base material 310.

For example, referring to FIG. 2, the multi-emission QD 320 may include a first core 110 having a first thickness, a second core 130, which has a second thickness being smaller than the first thickness, at an outer side of the first core 110, a first shell 120 between the first and second cores 110 and 130 and a second shell 140 at an outer side of the second core 130. The multi-emission QD 320 may emit first light having a first wavelength and second light having a second wavelength.

Accordingly, the QD film 300 provides a dual emission characteristic.

When two type QDs emitting different color lights are mixed in a film to provide the dual emission characteristic, the uniform emission property is not secured. For example, the QDs may be aggregated such that different color lights may be emitted in different positions.

However, since each QD 320 in the QD film 300 has the multi-emission characteristic, the above problem is prevented.

Figure 11:
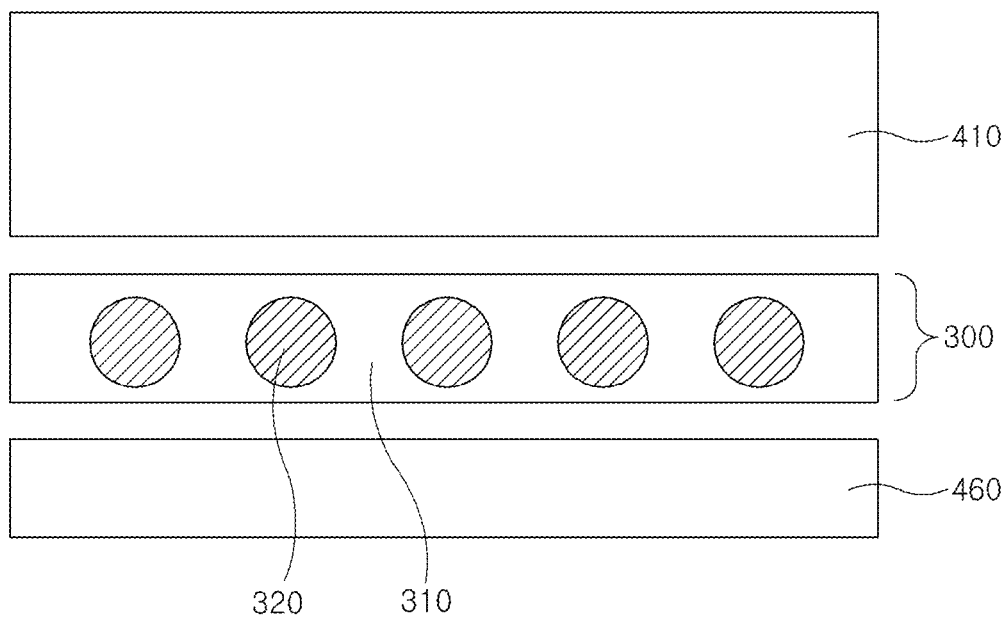
FIG. 11 is a schematic cross-sectional view of an LCD device according to an embodiment of the present disclosure.
Figure 12:
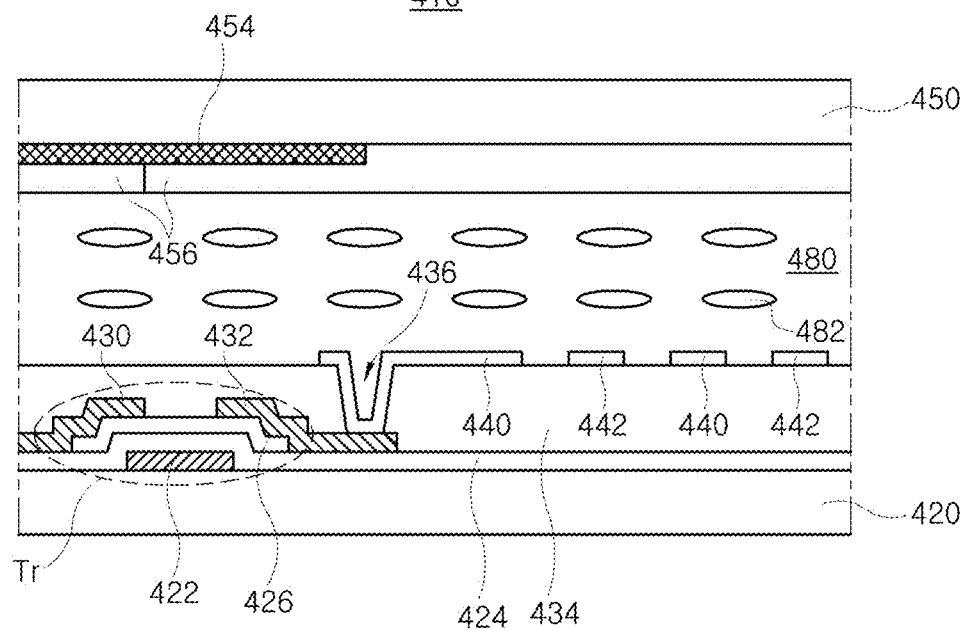
FIG. 12 is a schematic cross-sectional view of a liquid crystal panel in FIG. 11 according to an embodiment of the present disclosure.

FIG. 11 is a schematic cross-sectional view of an LCD device according to an embodiment of the present disclosure, and FIG. 12 is a schematic cross-sectional view of a liquid crystal panel in FIG. 11.

As shown in FIG. 11, the liquid crystal display (LCD) device 400 as a display device includes a liquid crystal panel 410, a backlight unit 460 under the liquid crystal panel 410 and a QD film 300 between the liquid crystal panel 410 and the backlight unit 460.

Referring to FIG. 12, the liquid crystal panel 410 includes first and second substrates 420 and 450 facing each other and a liquid crystal layer 480 including liquid crystal molecules 482 disposed between the first and second substrates 420 and 450.

A gate electrode 422 is formed on the first substrate 420, and a gate insulating layer 424 is formed to cover the gate electrode 422. In addition, a gate line (not shown) being connected to the gate electrode 422 is formed on the first substrate 420.

A semiconductor layer 426 corresponding to the gate electrode 422 is formed on the gate insulating layer 424. The semiconductor layer 426 includes an oxide semiconductor material. Alternatively, the semiconductor layer 426 may include an active layer of intrinsic amorphous silicon and an ohmic contact layer of impurity-doped amorphous silicon.

A source electrode 430 and a drain electrode 432 are formed on the semiconductor layer 426 to be spaced apart from each other. In addition, a data line (not shown), which is connected to the source electrode 430 and crosses the gate line to define a pixel region, is formed on the gate insulating layer 424.

The gate electrode 422, the semiconductor layer 426, the source electrode 430 and the drain electrode 432 constitute a thin film transistor (TFT) Tr.

A passivation layer 434, which includes a drain contact hole 436 exposing the drain electrode 432, is formed on the TFT Tr.

A pixel electrode 440, which is connected to the drain electrode 432 through the drain contact hole 436, and a common electrode 442, which is alternately arranged with the pixel electrode 440, are formed on the passivation layer 434.

A black matrix 454, shielding a non-display region, e.g., the TFT Tr, the gate line and the data line, is formed on the second substrate 450, and a color filter layer 456 corresponding to the pixel region is formed on the second substrate 450.

The first and second substrates 420 and 450 are attached with the liquid crystal layer 480 therebetween. The liquid crystal molecules 482 of the liquid crystal layer 480 are driven by an electric field between the pixel and common electrodes 440 and 442.

Although not shown, first and second alignment layers are formed over the first and second substrates 420 and 450 to be adjacent to the liquid crystal layer 480. In addition, first and second polarization plates, which have perpendicular transmission axes, are disposed at an outer side of the first and second substrates 420 and 450.

The backlight unit 460 includes a light source (not shown) and provides the light toward the liquid crystal panel 410.

The backlight unit 460 may be classified into a direct type and a side type according to a position of the light source, and the light source may be a fluorescent lamp or a light emitting diode (LED) package.

For example, the direct type backlight unit 460 may include a bottom frame (not shown) covering a rear side of the liquid crystal panel 410, and a plurality of light sources may be arranged on a horizontal bottom surface of the bottom frame.

The side type backlight unit 460 may include a bottom frame (not shown) covering a rear side of the liquid crystal panel 410 and a light guide plate (not shown) on or over a horizontal bottom surface of the bottom frame. The light source may be arranged at a side of the light guide plate.

The light source emits short wavelength light of about 430 to 470 nm.

The QD film 300 is positioned between the liquid crystal panel 410 and the backlight unit 460 and includes the multi-emission QDs 320. The QD film 300 may further include a base material 310, and the multi-emission QDs 320 may be dispersed in the base material 310.

For example, referring to FIG. 2, the multi-emission QD 320 may include a first core 110 having a first thickness, a second core 130, which has a second thickness being smaller than the first thickness, at an outer side of the first core 110, a first shell 120 between the first and second cores 110 and 130 and a second shell 140 at an outer side of the second core 130.

The light from the backlight unit 460 is absorbed by the QD film 300, and the light having a first wavelength and the light having a second wavelength are emitted from the QD film 300.

For example, the light source provides the light having a third wavelength, e.g., 430 to 470 nm, being smaller than the second wavelength, and a part of the light from the light source is converted into the light having the first wavelength and the light having the second wavelength by the QD film 300. As a result, the white light may be provided from the QD film 300.

The QD film 300 absorbs a part of the light from the backlight unit 460 and provides high color purity white light toward the liquid crystal panel 410. As a result, a display quality of the LCD device 400 is improved.

In addition, since the LCD device 400 includes a single QD film 300, a fabricating process of the LCD device 400 is simplified and the production cost of the LCD device 400 is reduced. Furthermore, a thickness of the LCD device 400 is decreased.

Figure 13:
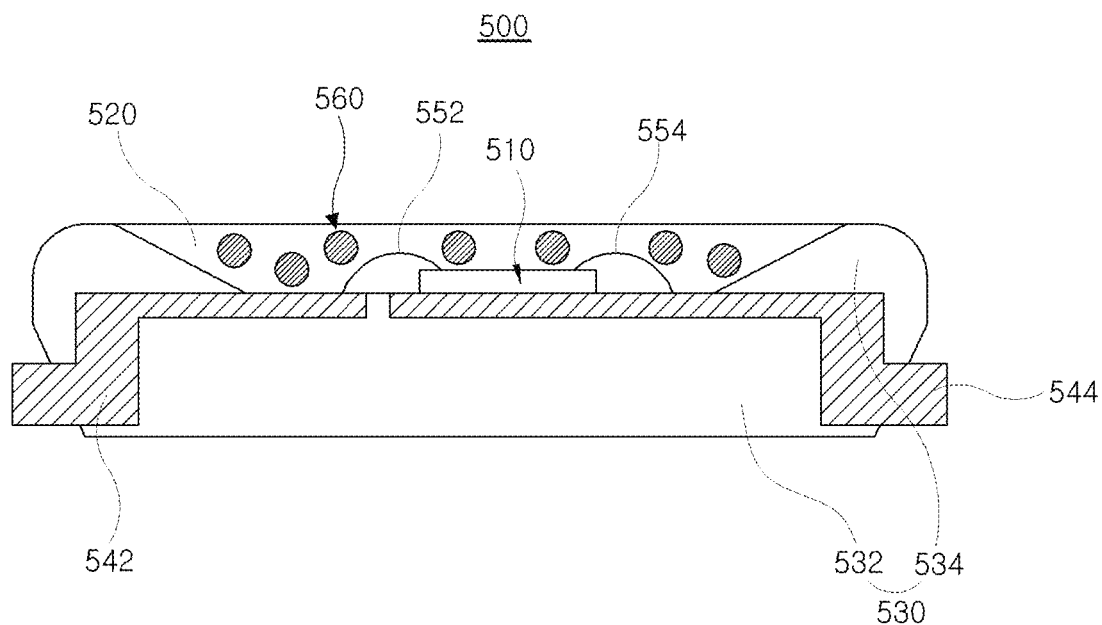
FIG. 13 is a schematic cross-sectional view of an LED package according to an embodiment of the present disclosure.

FIG. 13 is a schematic cross-sectional view of an LED package according to an embodiment of the present disclosure.

As shown in FIG. 13, the LED package 500 includes an LED chip 510 and an encapsulation part 520 covering the LED chip 510.

The encapsulation part 520 includes a plurality of multi-emission QDs 560. The encapsulation part 520 may further include a base material (not shown), and the multi-emission QDs 560 may be dispersed in the base material.

For example, referring to FIG. 2, the multi-emission QD 560 may include a first core 110 having a first thickness, a second core 130, which has a second thickness being smaller than the first thickness, at an outer side of the first core 110, a first shell 120 between the first and second cores 110 and 130 and a second shell 140 at an outer side of the second core 130.

The light from the LED chip 510 is absorbed by the multi-emission QDs 560 in the encapsulation part 520, and the light having a first wavelength and the light having a second wavelength are emitted from the multi-emission QDs 560 in the encapsulation part 520.

For example, the LED chip 510 provides the light having a third wavelength, e.g., 430 to 470 nm, being smaller than the second wavelength, and a part of the light from the LED chip 510 is converted into the light having the first wavelength and the light having the second wavelength by the multi-emission QDs 560 in the encapsulation part 520. As a result, the white light may be provided from the LED package 500.

The LED package 500 may further include a case 530 and first and second electrode leads 542 and 544, which are respectively connected to the LED chip 510 via first and second wires 552 and 554 and extend into an outside of the case 530.

The case 530 includes a body 532 and a side wall 534 protruding from an upper surface of the body 532 and serving as a reflection surface. The LED chip 510 is arranged on the body 532 and is surrounded by the side wall 534.

For example, the LED package 500 may be applied to a lightening device and/or a light source of the LCD device.

As mentioned above, the multi-emission QD 560 in the encapsulation part 520 absorbs a part of the light from the LED chip 510 and provides high color purity white light. Since the LED package 500 includes a single type QD 560, a fabricating process of the LED package 500 is simplified and the production cost of the LED package 500 is reduced.

Figure 14:
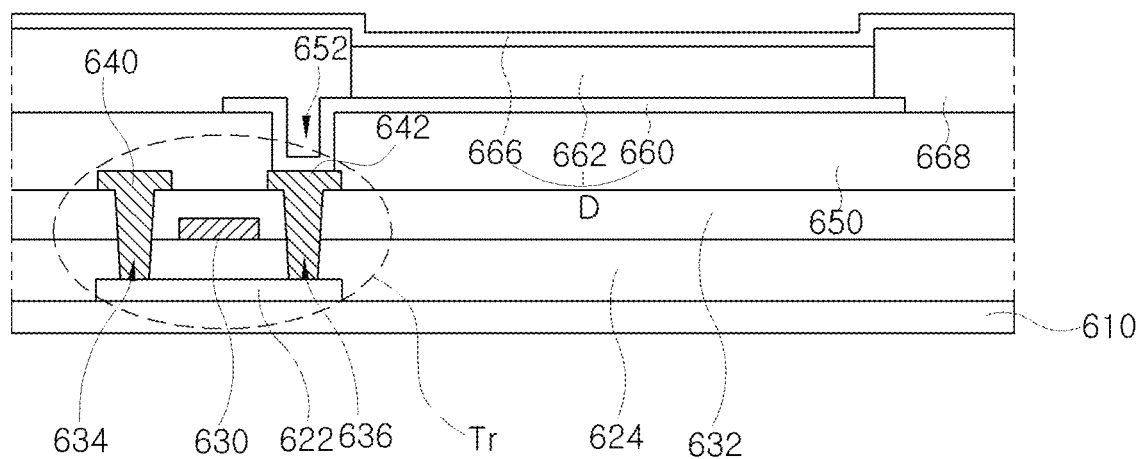
FIG. 14 is a schematic cross-sectional view of a display device according to an embodiment of the present disclosure.
Figure 15:
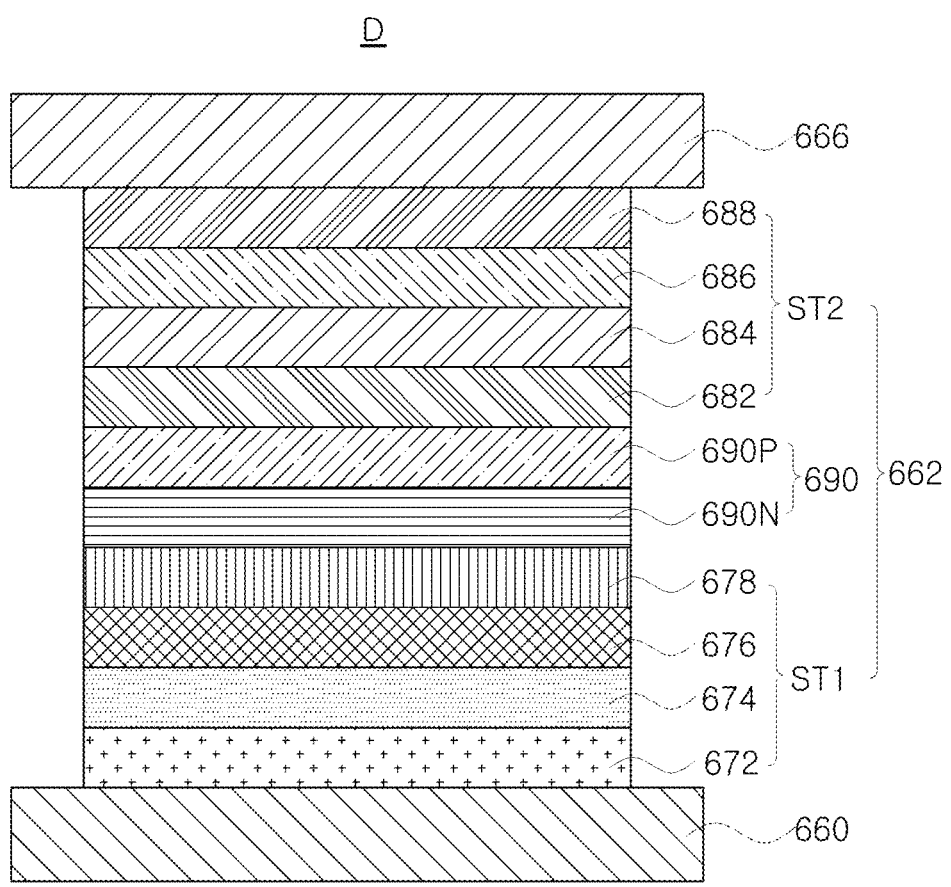
FIG. 15 is a schematic cross-sectional view of an emitting diode according to an embodiment of the present disclosure.

FIG. 14 is a schematic cross-sectional view of a display device according to an embodiment of the present disclosure, and FIG. 15 is a schematic cross-sectional view of an emitting diode according to an embodiment of the present disclosure.

As shown in FIG. 14, the display device 600 as a light emitting diode display device as a display device of the present disclosure includes a substrate 610, a driving element Tr on or over the substrate 610 and an emitting diode D connected to the driving element Tr.

A semiconductor layer 622 is formed on the substrate 610. The semiconductor layer 622 may include an oxide semiconductor material or polycrystalline silicon.

When the semiconductor layer 622 includes the oxide semiconductor material, a light-shielding pattern (not shown) may be formed under the semiconductor layer 622. The light to the semiconductor layer 622 is shielded or blocked by the light-shielding pattern such that thermal degradation of the semiconductor layer 622 can be prevented. On the other hand, when the semiconductor layer 622 includes polycrystalline silicon, impurities may be doped into both sides of the semiconductor layer 622.

A gate insulating layer 624 is formed on the semiconductor layer 622. The gate insulating layer 624 may be formed of an inorganic insulating material such as silicon oxide or silicon nitride.

A gate electrode 630, which is formed of a conductive material, e.g., metal, is formed on the gate insulating layer 624 to correspond to a center of the semiconductor layer 622.

An interlayer insulating layer 632, which is formed of an insulating material, is formed on an entire surface of the substrate 610 including the gate electrode 630. The interlayer insulating layer 632 may be formed of an inorganic insulating material, e.g., silicon oxide or silicon nitride, or an organic insulating material, e.g., benzocyclobutene or photo-acryl.

The interlayer insulating layer 632 includes first and second contact holes 634 and 636 exposing both sides of the semiconductor layer 622. The first and second contact holes 634 and 636 are positioned at both sides of the gate electrode 630 to be spaced apart from the gate electrode 630.

A source electrode 640 and a drain electrode 642, which are formed of a conductive material, e.g., metal, are formed on the interlayer insulating layer 632. The source electrode 640 and the drain electrode 642 are spaced apart from each other with respect to the gate electrode 630 and respectively contact both sides of the semiconductor layer 622 through the first and second contact holes 634 and 636.

The semiconductor layer 622, the gate electrode 630, the source electrode 640 and the drain electrode 642 constitute the TFT Tr as a driving element.

In FIG. 14, the gate electrode 630, the source electrode 640, and the drain electrode 642 are positioned over the semiconductor layer 622. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 610 and cross each other to define a pixel region. In addition, a switching element, which is electrically connected to the gate line and the data line, may be disposed on the substrate 610. The switching element is electrically connected to the TFT Tr as the driving element.

In addition, a power line, which is parallel to and spaced apart from the gate line or the data line, may be formed on or over the substrate 610. Moreover, a storage capacitor for maintaining a voltage of the gate electrode 630 of the TFT Tr during one frame, may be further formed on the substrate 610.

A passivation layer 650, which includes a drain contact hole 652 exposing the drain electrode 642 of the TFT Tr, is formed to cover the TFT Tr.

A first electrode 660, which is connected to the drain electrode 642 of the TFT Tr through the drain contact hole 652, is separately formed in each pixel region. The first electrode 660 may be an anode and may be formed of a conductive material having a relatively high work function. For example, the first electrode 660 may be formed of a transparent conductive material such as indium-tin-oxide (ITO) or indium-zinc-oxide (IZO).

When the light emitting diode display device 600 is operated in a top-emission type, a reflection electrode or a reflection layer may be formed under the first electrode 660. For example, the reflection electrode or the reflection layer may be formed of aluminum-palladium-copper (APC) alloy.

A bank layer 668, which covers edges of the first electrode 660, is formed on the passivation layer 650. A center of the first electrode 660 in the pixel region is exposed through an opening of the bank layer 668.

An emitting layer 662 including a multi-emission QD (not shown) of the present disclosure is formed on the first electrode 660, and a second electrode is formed over the substrate 610 including the emitting layer 662. The second electrode 666 is positioned at an entire surface of the display area. The second electrode 666 may be a cathode and may be formed of a conductive material having a relatively low work function. For example, the second electrode 666 may be formed of aluminum (Al), magnesium (Mg) or Al—Mg alloy.

The first electrode 660, the emitting layer 662 and the second electrode 666 constitute the emitting diode D.

Referring to FIG. 15, the emitting layer 662 is positioned between the first and second electrodes 660 and 666 and includes a first emitting part ST1, a second emitting part ST2 and a charge generation layer (CGL) 690. Namely, the first and second emitting parts ST1 an ST2 and the CGL 690 constitute the emitting layer 662.

The CGL 690 is positioned between the first and second emitting parts ST1 and ST2 such that the first emitting part ST1, the CGL 690 and the second emitting part ST2 are sequentially stacked on the first electrode 660. Namely, the first emitting part ST1 is positioned between the first electrode 660 and the CGL 690, and the second emitting part ST2 is positioned between the second electrode 666 and the CGL 690.

The first emitting part ST1 includes a first emitting material layer (EML) 676. In addition, the first emitting part ST1 may further include a hole injection layer (HIL) 672, a first hole transporting layer (HTL) 674 and a first electron transporting layer (ETL) 678. The HIL 672 and the first HTL 674 are sequentially stacked between the first electrode 666 and the first EML 676, and the first ETL 678 is positioned between the first EML 676 and the CGL 690. At least one of the HIL 672, the first HTL 674 and the first ETL 678 may be omitted.

The second emitting part ST2 includes a second EML 684. In addition, the second emitting part ST2 may further include a second HTL 682, a second ETL 686 and an electron injection layer (EIL) 688. The second HTL 682 is positioned between the CGL 690 and the second EML 684, and the second ETL 686 and the EIL 688 are sequentially stacked between the second EML 684 and the second electrode 666. At least one of the second HTL 682, the second HTL 686 and the EIL 688 may be omitted.

The CGL 690 is positioned between the first and second emitting parts ST1 and ST2. Namely, the first and second emitting parts ST1 and ST2 are connected by the CGL 690. The CGL 690 may be a P-N junction type CGL including an N-type CGL 690N and a P-type CGL 690P.

The N-type CGL 690N is positioned between the first ETL 678 and the second HTL 682, and the P-type CGL 690P is positioned between the N-type CGL 690N and the second HTL 682.

The CGL 690 generates a charge or separates a charge into a hole and an electron such that the electron and the hole are provided into the first and second emitting parts ST1 and ST2, respectively.

The N-type CGL 690N provides the electron into the first ETL 678 of the first emitting part ST1, and the first ETL 678 provide the electron into the first EML 676 of the first emitting part ST1. On the other hand, the P-type CGL 690P provide the hole into the second HTL 682 of the second emitting part ST2, and the second HTL 682 provide the hole into the second EML 684 of the second emitting part ST2. Accordingly, the emitting efficiency of the emitting diode D including the first and second EMLs 676 and 684 is improved, and the driving voltage of the emitting diode D is reduced.

The first EML 676 includes a blue emitting material (not shown), and the second EML 684 includes the multi-emission QD (not shown). For example, the blue emitting material may be an organic emitting material having a phosphorescent property or a fluorescent property or an inorganic emitting material such as a QD.

For example, referring to FIG. 2, the multi-emission QD may include a first core 110 having a first thickness, a second core 130, which has a second thickness being smaller than the first thickness, at an outer side of the first core 110, a first shell 120 between the first and second cores 110 and 130 and a second shell 140 at an outer side of the second core 130.

In the emitting diode D, blue light is emitted from the first emitting material in the first EML 676 of the first emitting part ST1, and the light having the first wavelength and the light having the second wavelength are emitted from the multi-emission QD in the second EML 684 of the second emitting part ST2. Accordingly, white light is provided from the emitting diode D.

Alternatively, the first EML 676 may include the multi-emission QD, and the second EML 684 may include the blue emitting material.

Although not shown, a color filter, which includes red, green and blue color filter patterns corresponding to a respective pixel region, may be disposed between the substrate 610 and the emitting diode D or on the emitting diode D.

Accordingly, the emitting diode D and the light emitting diode display device 600 has a W-OLED characteristic with two emitting stacks ST1 and ST2 such that a fabricating process of the emitting diode D and the light emitting diode display device 600 is simplified and the production cost of the emitting diode D and the light emitting diode display device 600 is reduced. Furthermore, a thickness of the emitting diode D and the light emitting diode display device 600 is decreased. Moreover, the light uniformity is secured such that a display quality of the light emitting diode display device 600 is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A quantum dot comprising:
    a first core having a first thickness along an axis from a first surface to a second surface of the first core;
    a first shell enclosing the first core;
    a second core surrounding the first shell, the second core having a second thickness along the same axis smaller than the first thickness; and
    a second shell enclosing the second core,
    wherein the second thickness of the second core is a combination of a thickness of a part of the second core on the first surface of the first core and a thickness of another part of the second core on the second surface of the first core.

2. The quantum dot of claim 1, wherein the first core is configured to emit light of a first color, and wherein the second core is configured to emit light of a second color different from the first color.

3. The quantum dot of claim 2, wherein:
    responsive to applying a first voltage to the quantum dot, an intensity of light of the first color is greater than an intensity of light of the second color, and
    responsive to applying a second voltage different from the first voltage, the intensity of light of the second color is greater than the intensity of light of the first color.

4. The quantum dot of claim 3, wherein the first voltage is smaller than the second voltage, and wherein a wavelength of the first color is longer than a wavelength of the second color.

5. The quantum dot of claim 1, wherein the first core or the second core includes at least one of InP, InGaP, CdSe, CdSeS.

6. The quantum dot of claim 1, wherein the first shell or the second shell includes ZnS or ZnSe.

7. The quantum dot of claim 1, further comprising:
a third shell enclosing the second shell, wherein a material of the third shell is different from a material of the first shell or a material of the second shell.

8. The quantum dot of claim 7, wherein the first shell or the second shell includes ZnSe, and the third shell includes ZnS.

9. A quantum dot film comprising:
a base material; and
a plurality of quantum dots dispersed in the base material, the plurality of quantum dots including the quantum dot of claim 1.

10. A liquid crystal display (LCD) device comprising:
a backlight unit configured to emit light;
a liquid crystal panel; and
the quantum dot film of claim 9 disposed between the backlight unit and the liquid crystal panel.

11. A light emitting diode (LED) package comprising:
A LED chip configured to emit light; and
an encapsulation part covering the LED chip including a plurality of quantum dots, the plurality of quantum dots including the quantum dot of claim 1.

12. A liquid crystal display (LCD) device comprising:
a backlight unit including the LED package of claim 11; and
a liquid crystal panel on the backlight unit.

13. A display device comprising:
a substrate;
a driving element on the substrate; and
an emitting diode on the substrate electrically connected to the driving element, the emitting diode including:
a first electrode,
an emitting layer on the first electrode including a plurality of quantum dots, the plurality of quantum dots including the quantum dot of claim 1, and
a second electrode on the emitting layer.

14. The display device of claim 13, wherein the emitting layer includes:
a first emitting part including the plurality of quantum dots, and
a second emitting part configured to emit light of a blue color.

15. A quantum dot comprising:
a first core configured to emit light of a first color;
a first shell enclosing the first core;
a second core surrounding the first shell, the second core configured to emit light of a second color different from the first color; and
a second shell enclosing the second core,
wherein responsive to applying a first voltage to the quantum dot, an intensity of light of the first color is greater than an intensity of light of the second color, and
responsive to applying a second voltage different from the first voltage, the intensity of light of the second color is greater than the intensity of light of the first color.

16. The quantum dot of claim 15, wherein the light of the first color is light of a red color, and wherein the light of the second color is light of a green color.

17. The quantum dot of claim 16,
wherein the first core has a first thickness along an axis from a first surface to a second surface of the first core, and wherein the second core has a second thickness along the same axis smaller than the first thickness.

18. The quantum dot of claim 15, wherein the first voltage is smaller than the second voltage, and wherein a wavelength of the first color is longer than a wavelength of the second color.

* * * * *